United States Patent
Buck, Jr.

(10) Patent No.: US 11,359,915 B1
(45) Date of Patent: Jun. 14, 2022

(54) ACTIVE OPTICAL COMPRESSIVE SENSING

(71) Applicant: LOCKHEED MARTIN CORPORATION, Bethesda, MD (US)

(72) Inventor: Joseph Robert Buck, Jr., Superior, CO (US)

(73) Assignee: LOCKHEED MARTIN CORPORATION, Bethesda, MD (US)

(*) Notice: Subject to any disclaimer, the term of this patent is extended or adjusted under 35 U.S.C. 154(b) by 33 days.

(21) Appl. No.: 16/875,956

(22) Filed: May 15, 2020

(51) Int. Cl.
    *G01B 11/25* (2006.01)
    *F21V 8/00* (2006.01)
    *G02B 19/00* (2006.01)

(52) U.S. Cl.
    CPC .......... *G01B 11/254* (2013.01); *G02B 6/0065* (2013.01); *G02B 19/0052* (2013.01); *G02B 19/0061* (2013.01)

(58) Field of Classification Search
CPC ............ G01B 9/02091; G01B 9/02044; G01B 2290/70; G01B 9/02081; G01B 11/25; G01B 11/14; G01B 11/2441; G01B 9/02004; G01B 9/02045; G01B 9/02069; G01B 9/02072; G02B 21/0032; G02B 21/0076; G02B 21/06; G02B 21/16; G02B 21/367; G02B 27/58; G02B 21/0056; G02B 21/0092; G02B 21/22; G02B 21/26; G02B 27/10; G02B 21/361; G02B 26/0833; G02B 27/0025; G02B 27/0927; G02B 27/0988; G02B 27/106; G02B 27/48; G02B 30/27; G02B 23/2423; G02B 23/2469; G02B 23/26; G02B 27/4244; G02B 27/4272; G02B 5/1828; G02B 6/262; G02B 6/32; G02B 6/3624
See application file for complete search history.

(56) References Cited

U.S. PATENT DOCUMENTS

| | | | |
|---|---|---|---|
| 8,125,549 B2 * | 2/2012 | Dekel | H04N 5/335 348/335 |
| 2009/0027390 A1 * | 1/2009 | Bin Zafar | G06T 15/506 345/426 |
| 2015/0201176 A1 * | 7/2015 | Graziosi | H04N 13/111 348/43 |
| 2019/0219696 A1 * | 7/2019 | Xu | G01S 7/4915 |
| 2019/0369247 A1 * | 12/2019 | Lindner | G01S 17/894 |
| 2020/0120299 A1 * | 4/2020 | Li | G06K 9/209 |

FOREIGN PATENT DOCUMENTS

| | | | | |
|---|---|---|---|---|
| CN | 105828087 A | * | 8/2016 | |
| CN | 106796293 B | * | 1/2020 | ........... G01S 7/4816 |
| DE | 102008002725 A1 | * | 12/2009 | ........ H04N 13/0253 |
| EP | 3413173 A1 | * | 12/2018 | ........... G06F 3/0304 |
| WO | WO-9306693 A1 | * | 4/1993 | ............... H04N 5/21 |
| WO | WO-2017137415 A1 | * | 8/2017 | ........... A61B 5/0261 |

* cited by examiner

*Primary Examiner* — Michael P Stafira
(74) *Attorney, Agent, or Firm* — Bakerhostetler

(57) ABSTRACT

An active optical compressive sensing system includes an optical source to generate light for illuminating a target and a pattern generator to generate a pattern. A pattern controller controls an operation of the pattern generator to cause generation of a desired pattern. The pattern is a spatial filtering pattern that enables data compression by generating sparse scattered data. Applying the pattern allows a logarithmic resource scaling.

7 Claims, 15 Drawing Sheets

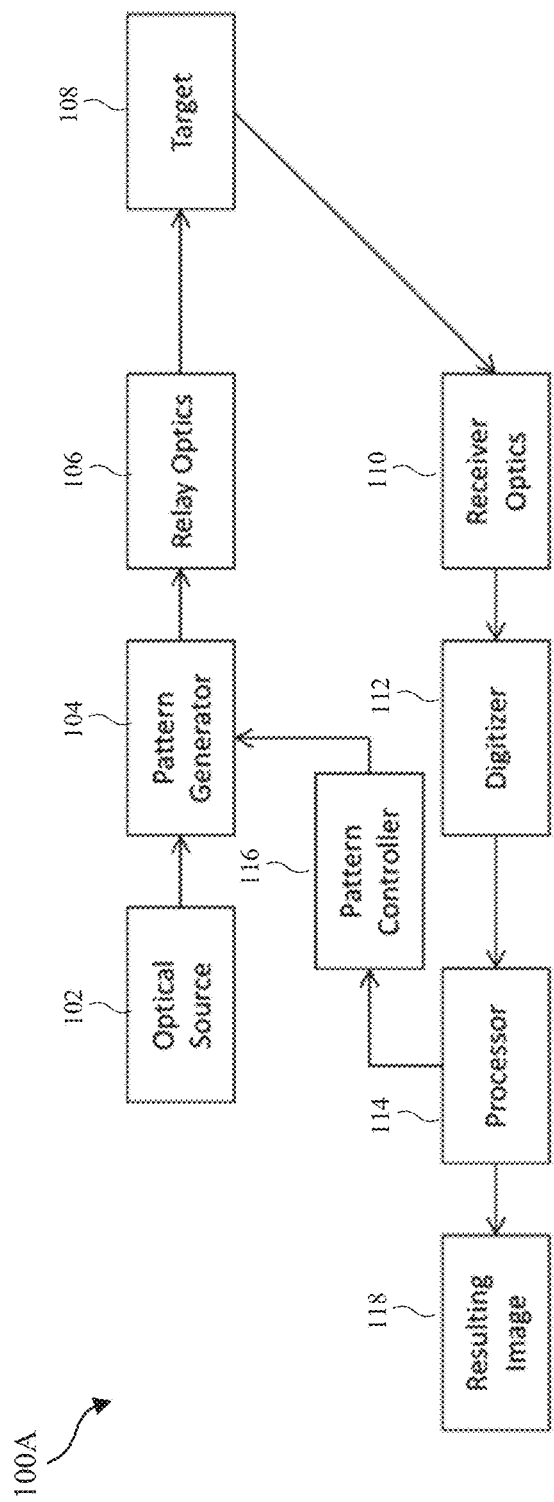
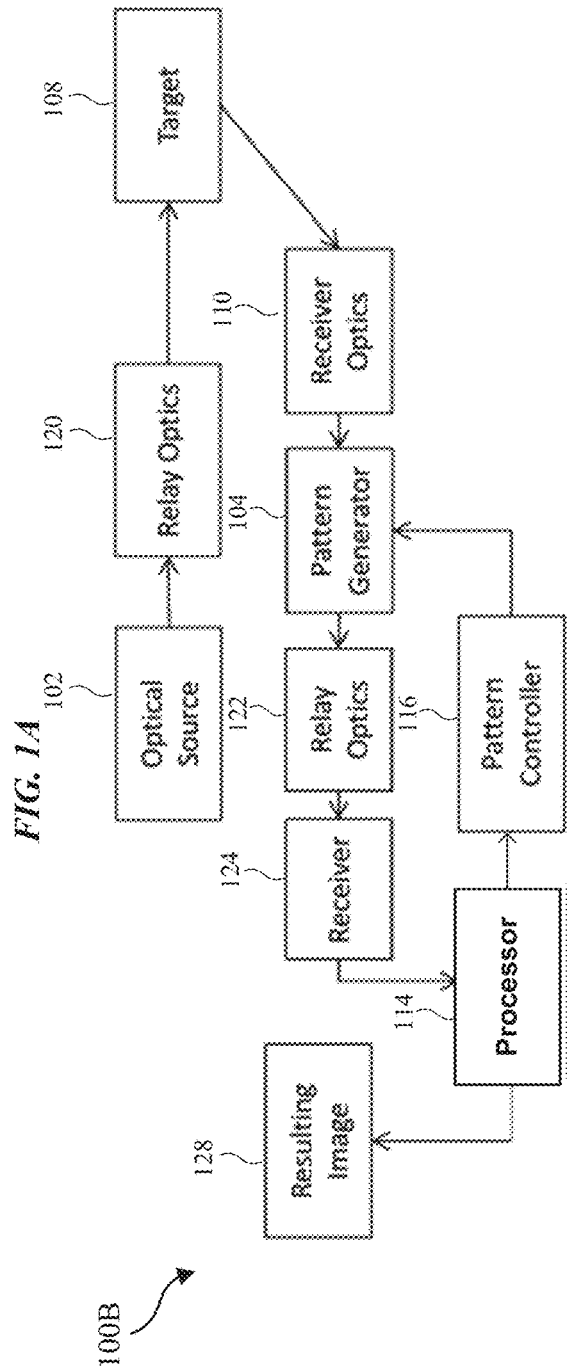
FIG. 1A
FIG. 1B

1500A

1500B

1500C

ACTIVE OPTICAL COMPRESSIVE SENSING

STATEMENT REGARDING FEDERALLY SPONSORED RESEARCH OR DEVELOPMENT

Not applicable.

FIELD OF THE INVENTION

The present invention generally relates to optical sensing and, more particularly, to active optical compressive sensing.

BACKGROUND

Compressive sensing techniques allow direct measurement of compressed data products with significant reductions in both data and optical energy for sparse signals of interest. For traditional active remote sensing systems, the required optical energy scales linearly with the covered area. The size, weight and power (SWaP) of typical optical sensing systems are constrained by the signal requirements and radiometry of the sensing scenario. For a given aperture size, desired resolution, distance from the object, and waveform, the radiometry analysis can yield the required optical pulse energy to achieve a desired signal-to-noise ratio. Existing active space-borne optical sensing and imaging systems have large SWaP due to housing elaborate optical designs and are high cost due to the exquisite optical engineering needed to meet the design requirements.

The application requirements usually determine the coverage rate, which then yields the required transmitter power. Once the fundamental noise limits (e.g., shot-noise limit) are achieved, the transmitter requirements can only be reduced with compromises on the application parameters. The traditional active remote sensing systems can be based on a single pixel measured with a flying-spot or a multipixel receiver with wide area illumination. In either case, the total energy requirements of the active remote sensing systems remain the same. The flying-spot or the multipixel receiver architectures just provide a way to make a trade for power versus time with constraints on coverage rate. In these examples, the active sensor collects data used to generate an image. However, that collected data can be significantly compressed through postprocessing, since it is sparse.

SUMMARY

According to various aspects of the subject technology, methods and configurations for providing active optical compressive sensing are disclosed. The techniques of the subject technology provide a method of directly measuring sparse data with orders-of-magnitude reduction in total energy for wide area coverage. The disclosed solution provides a significant reduction in the transmitter requirements for applications such as wide area search with very sparse signals.

In one or more aspects, an active optical compressive sensing system includes an optical source to generate light for illuminating a target and a pattern generator to generation of a pattern. A pattern controller controls an operation of the pattern generator to cause generating a desired pattern. The pattern is a spatial filtering pattern that enables data compression by generating sparse scattered data. Applying the pattern allows a logarithmic resource scaling.

In other aspects, an active optical remote sensing system includes a waveform encoder to modulate a phase or an amplitude of source light generated by an optical source to generate modulated light. The system further includes an optical mixer to receive the source light and the modulated light in two different paths and to generate a phase-error signal. Relay optics projects the modulated light onto a target and relays resulting scattered light from the target to an optical heterodyne detector to generate a detector signal. A processor receives the phase-error signal and the detector signal and generates a processed phase signal.

In yet other aspects, a method of implementing active optical compressive sensing includes producing light for illuminating a target, generating a pattern to optically modulate the produced light using a desired pattern, and enabling data compression by generating sparse scattered data from the target using the pattern. The method further includes detecting the sparse scattered data and processing the detected sparse scattered data to reconstruct an image of the target with a logarithmic resource scaling.

The foregoing has outlined rather broadly the features of the present disclosure so that the following detailed description can be better understood. Additional features and advantages of the disclosure, which form the subject of the claims, will be described hereinafter.

BRIEF DESCRIPTION OF THE DRAWINGS

For a more complete understanding of the present disclosure and the advantages thereof, reference is now made to the following descriptions to be taken in conjunction with the accompanying drawings describing specific aspects of the disclosure, wherein:

FIG. 1A and FIG. 1B are schematic diagrams illustrating examples of system architectures for active optical compressive spatial imaging, according to certain aspects of the disclosure.

DETAILED DESCRIPTION

Figure 2:
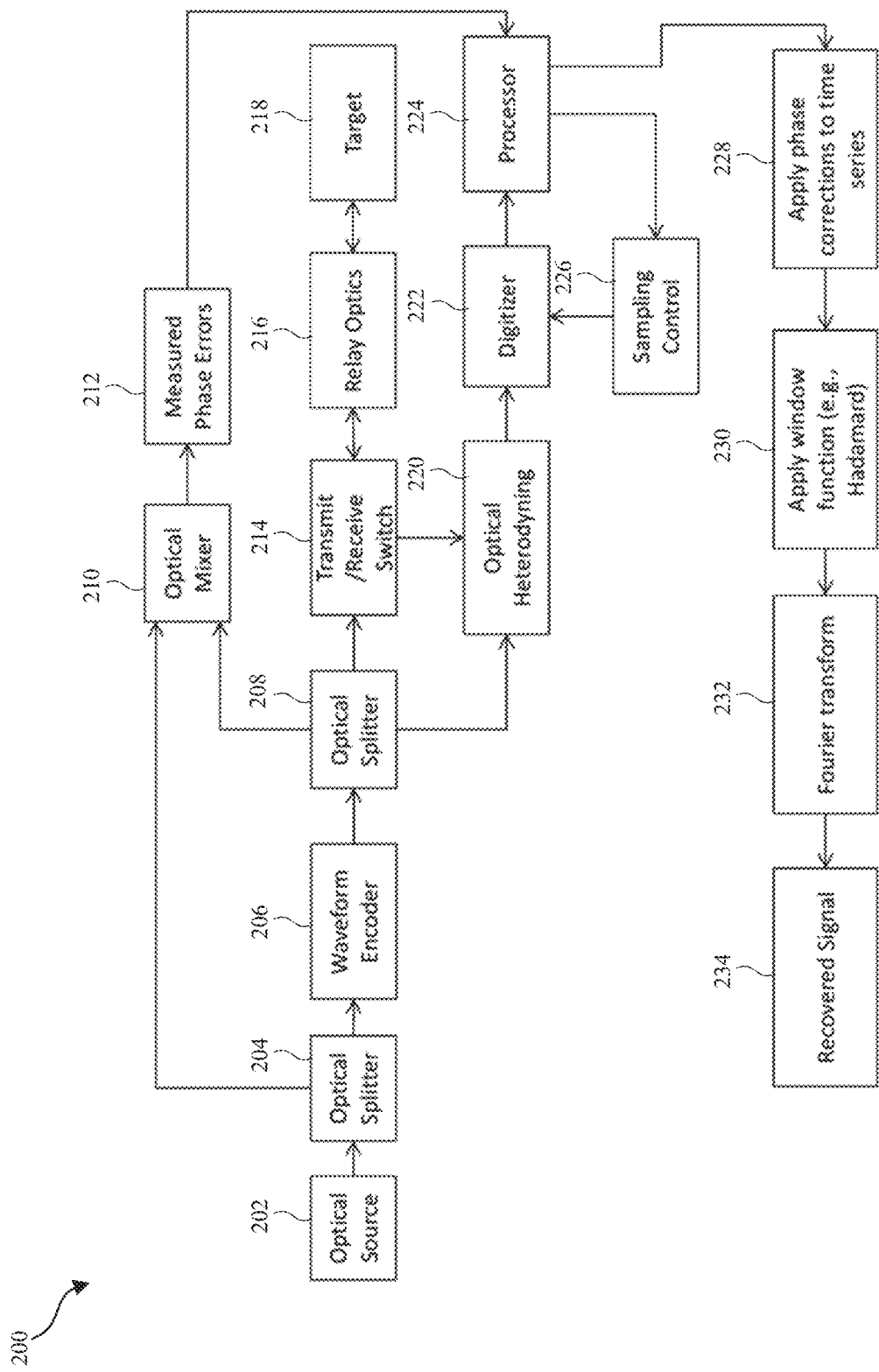
FIG. 2 is a schematic diagram illustrating an example of a system architecture for active optical remote sensing and compressive sensing of ladar ranging data, according to certain aspects of the disclosure.

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and can be practiced using one or more implementations. In one or more instances, well-known structures and components are shown in block diagram form in order to avoid obscuring the concepts of the subject technology.

In some aspects of the present technology, methods and configurations for providing active optical compressive sensing are disclosed. The techniques of the subject technology are based on directly measuring sparse data with orders-of-magnitude reduction in total energy for wide area coverage. The disclosed techniques allow for achieving of a significant reduction in the transmitter optical energy requirements for applications such as wide area search with very sparse signals. An illustration of what is meant by sparse and compressible is shown in the next section. For traditional active remote sensing systems, the required optical energy scales linearly with the covered area. The techniques of the subject technology demonstrate that this scaling can be changed to logarithmic, which provides significant advantages for wide area active sensing.

Convex optimizations for sparse data recovery have been implemented by others for passive imaging architectures. The convex optimization is a subfield of mathematical optimization that studies the problem of minimizing convex functions over convex sets. Applying the convex optimization for compressive sensing enables reducing the total energy used to measure the data of interest by directly measuring the signal in a compressed basis set. The disclosed solution can apply convex optimizations to active optical remote sensing. As stated earlier, the transmitter is typically the SWaP driver for an active optical system, with the transmitter power requirements set by the radiometry for the sensing geometry and voxel parameters, which include aperture diameter (DA), object range (R), wavelength (λ), object reflectivity (ρ) and pixel resolution (dx). The signal-to-noise requirements depend on the noise and clutter, and the sensor parameters and the signal-to-noise determine the required pulse energy. Because typical active sensor data is very sparse, there are significant opportunities for reducing the total transmitted energy by applying compressive sensing techniques.

As shown by the disclosure herein, wide area imaging can obtain orders of magnitude reduction over a traditional ladar sensing architecture with minimal system changes. Specifically, the subject technology can be applied in a large number of applications and provides architectures for active optical compressive spatial imaging, active optical remote sensing, coherent detection, linear mode detection and Geiger mode detection implementation. The disclosure further includes algorithms for image recovery, compressive sensing for efficient change detection, estimation of data requirements based on measured variance, expansion to a wavelet basis set, implementing a deterministic basis set, reduction of platform pointing requirements and additional reductions for change detection for imaging. The disclosed subject matter further includes algorithms for compressive sensing of ladar ranging data; nonlinear fast Fourier transform (FFT) for efficient sparsely sampled signal recovery; combination of spatial and temporal active compressive sensing for 3D surface recovery; basis projection optimization for Geiger mode saturation mitigation; recovering sparse, wide-area data in high-clutter environments; and recovery of sparse, wide-area data in low clutter environments.

The above techniques have been applied to passive imaging systems and for one-dimensional signal processing and recovery. The subject technology uses the mathematical constructs to reduce optical energy and data requirements for active sensing and imaging systems. The energy (and data) requirements for a traditional ladar sensor scale with the number of pixels, n, in the scene. With a compressive sensing architecture, this scaling becomes a polynomial of log n, with the number of measurements scaling as a polynomial of log n. For a large number of pixels, this can be an orders-of-magnitude reduction in system requirements. It is important to note that the scaling and coefficients depend on the scene complexity and noise. Approaching these information-theory limits requires an optimized choice of projection measurement basis sets. The techniques of the subject technology work even without a priori knowledge of the scene. There are additional improvements when information about the scene is exploited, as discussed in more detail herein.

FIG. 1A and FIG. 1B are schematic diagrams illustrating examples of system architectures 100A and 100B for active optical compressive spatial imaging, according to certain aspects of the disclosure. The system architecture 100A corresponds to an active optical compressive spatial imaging. The system architecture 100A uses a bistatic setup with patterns on the transmitted light as discussed herein. The system architecture 100A includes an optical source 102, a pattern generator 104, a relay optics 106, a target 108, a receiver optics 110, a digitizer 112, a processor 114, a pattern controller 116, and a resulting image 118.

The optical source 102 is a light source, with examples including a laser diode, a fiber laser, a super-luminescent LED, or an LED. The pattern generator 104 can be a micro-electromechanical system (MEMS) mirror array or liquid crystal spatial light modulator and can spatially modulate the intensity of the light generated by the optical source 102. The relay optics 106 can be a single lens or a lens system that relays the spatially modulated light from the pattern generator 104 to the target 108 so that the generated pattern is scaled to the desired size and in focus at the target 108. The receiver optics 110 can include the same or a separate aperture that relays the light scattered from the target 108 (illuminated scene) to a light detector within the receiver optics 110. The electrical signal generated by the detector is then passed to the digitizer 112 (through an optional amplifier when needed) to convert the detector electrical signal to a digital signal. The digital signal is processed by the processor 114, which performs the desired digital signal processing for the convex optimization to generate the image as described in more detail herein.

The pattern controller 116 can be a separate interface or combined with the processor 114 and can control the pattern generator 104. In some implementations, the pattern controller 116 may cause the pattern generator 104 to select a desired pattern from a list of patterns, for example, stored in memory, or select a pattern generation algorithm stored in the memory for execution by the pattern generator 104 or the processor 114. The pattern generation algorithm can generate a desired pattern based on a number of parameters including parameters of the scene and/or based on prior image data of the scene.

The system architecture 100B corresponds to an active optical compressive spatial imaging. The system architecture 100B uses a bistatic setup with patterns on the received light as discussed herein. The system architecture 100B includes the optical source 102, a transmit relay optics 120, the target 108, a receiver optics 110, the pattern generator 104, a receive relay optics 122, a receiver 124, a processor 114, a pattern controller 116, and a resulting image 128. The transmit relay optics 120 illuminates the region of interest and the receiver optics 110 maps the region of interest onto the pattern generator 104, which could be a MEMS array or amplitude spatial light modulator. The receive relay optics 122 relays the image on the pattern generator 104 to a detector within the receiver 124. The functionalities of the processor 114 and the pattern controller 116 are as discussed above.

The techniques of the subject technology are based on using the patterns generated by the pattern generator 104 to provide a sparse data from the illuminated scene and directly measure the sparse data with orders-of-magnitude reduction in total energy and significant reduction in the amount of data processing for a wide area coverage.

FIG. 2 is a schematic diagram illustrating an example of a system architecture 200 for active optical remote sensing and compressive sensing of ladar ranging data, according to certain aspects of the disclosure. The system architecture 200 includes an optical source 202, a first optical splitter 204, a waveform encoder 206, a second optical splitter 208, an optical mixer 210, a transmit/receive switch 214, a relay optics 216, a target 218, an optical heterodyne module 220, a digitizer 222, a processor 224, a sampling control module 226, a phase correction module 228, a window function module 230, and a Fourier transform module 232.

This system architecture 200 can be used for applications in optical remote sensing. The optical source 202 can be a laser diode, fiber laser, super-luminescent LED, or LED. The first and second optical splitters 204 and 208 can be free-space beam splitters or fiber-based splitters. The waveform encoder 206 can be a direct modulator of the optical source, an acousto-optic modulator, a Mach-Zehnder-based amplitude modulator, a phase modulator, or a combination of these devices to create the desired waveform. The optical mixer 210 receives signals before and after the waveform encoder 206 in two different paths and can be a beam splitter with the appropriate delays on each path in order to create a phase signal to measure the waveform characteristics. The optical mixer 210 generates measured phase errors 212, which are passed to the processor 224. The transmit/receive switch 214 can be a nonpolarizing beam splitter, a polarizing beam splitter, or a Faraday crystal-based device, which can be either free-space or fiber-based components. The relay optics 216 maps the light from the transmit/receive switch 214 to a region of interest at the location of the target 218 and relays scattered light from the target 218 to the transmit/receive switch 214.

The optical heterodyne module 220 is a heterodyne detector that can use either free space or fiber-based components, including beam splitters, to mix the scattered signals received from the transmit/receive switch 214 in a heterodyne, balanced heterodyne, quadrature, or balanced quadrature configuration. The signal from the heterodyne detector can then be passed through an amplifier (not shown for simplicity) prior to the digitizer 222. The digitized signal from the digitizer 222 is then passed to the processor 224 for processing. The sampling control module 226 controls sampling of the digitizer 222. The sampling control module 226 can take either regularly sampled data or randomly spaced samples from the processor 224, with a controlled distribution setting the moments of the time spacing. The measured waveform phase errors 212 are sent by the processor 224 to the phase correction module 228 as a correction to the sampled data either in the time or frequency domain or a combination of time and frequency domains. The corrected data is then windowed, by the window function module 230, using any (or no) window function. The windowed corrected data is then passed to the Fourier transform module 232. The output of the Fourier transform module 232 is a recovered signal 234 that is a corrected signal representing the desired ladar data product. Examples of the recovered signal 234 include amplitude as a function of range in the region of interest.

In one or more implementations, the sampling control module 226, the phase correction module 228, the window function module 230 and the Fourier transform module 232 can be implemented in hardware, firmware or software executable by the processor 224 or any other processor of the system, including a general processor.

Figure 3:
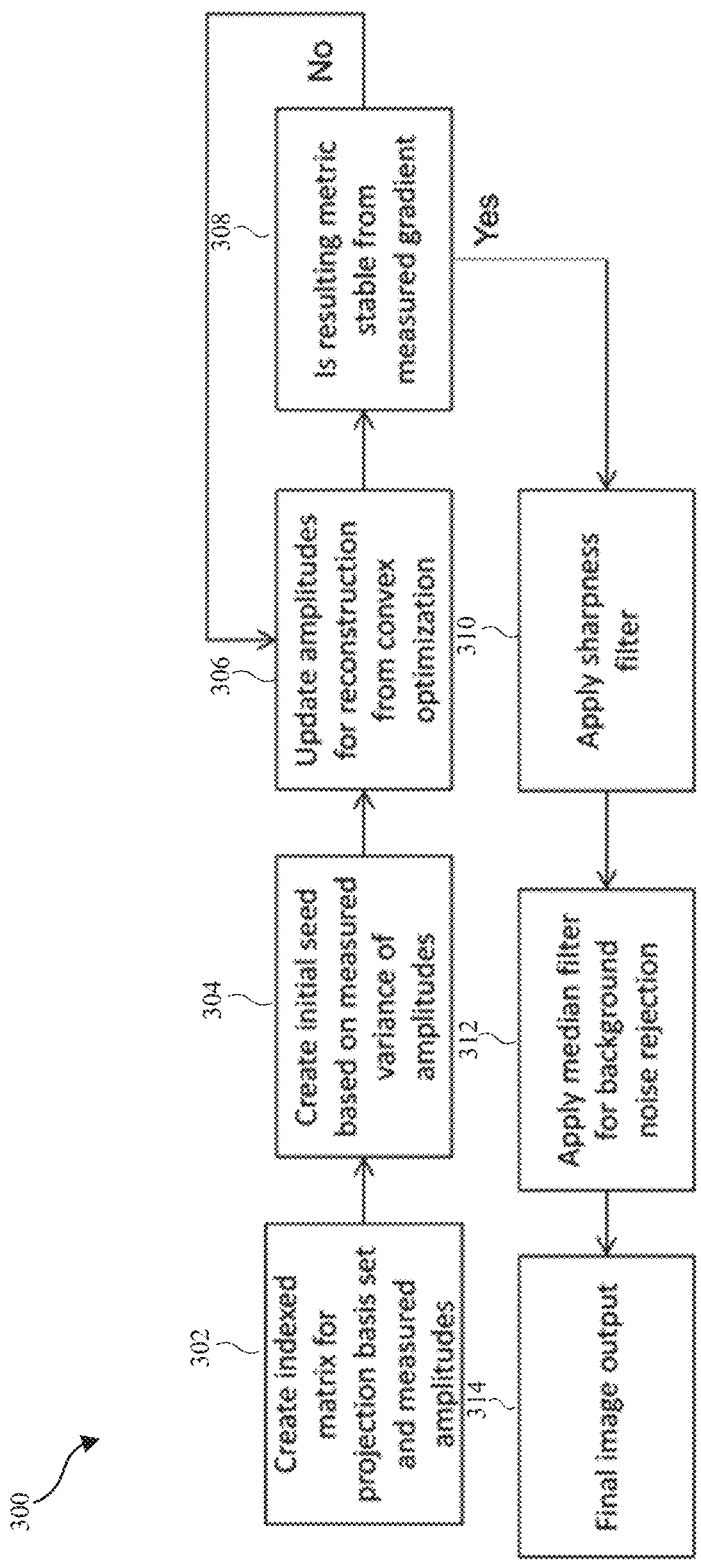
FIG. 3 is a flow diagram illustrating an example of an algorithm for image recovery, according to certain aspects of the disclosure.

FIG. 3 is a flow diagram illustrating an example of an algorithm 300 for image recovery, according to certain aspects of the disclosure. This example algorithm 300 uses entropy within the image as the evaluation metric. Other possible scene metric examples include sharpness and contrast with and without thresholds to reduce clutter impacts. The algorithm 300 starts at operation block 302, where an indexed matrix for a projection basis set and measured amplitudes are created. The projection basis set is created using one of several methods, including pseudo-random lists for the matrices, wavelets based on the scene or prior images, or other random generation in either binary or greyscale, depending on the imaging under consideration. At operation block 304, an initial seed is created based on measured variance of amplitudes using the measured starting points from the amplitudes recovered. At operation block 306, amplitudes are updated for reconstruction from convex optimization. At operation block 308, the metrics computed using either a least-squares or $L_1$ optimization from measured gradients are checked for stability. If the metrics are not stable, the control is passed to operation block 306. The gradients are computed using the desired scene metric to evaluate if the solution has closed on the amplitudes for reconstruction based on the measured gradient from the previous estimator update. Once the metric has closed on the extremum, the solution is tested for global stability by comparing to the other side of the gradient. If the solution is a global optimum, the loop stops. The resulting image can be further improved by applying a sharpness filter at operation block 310. Another improvement can be obtained at operation block 312 by applying median filters to the image with a de-noise algorithm for clutter rejection. The steps of operation blocks 310 and 312 are optional. The result of the algorithm 300 is a final image output 314.

Figure 4:
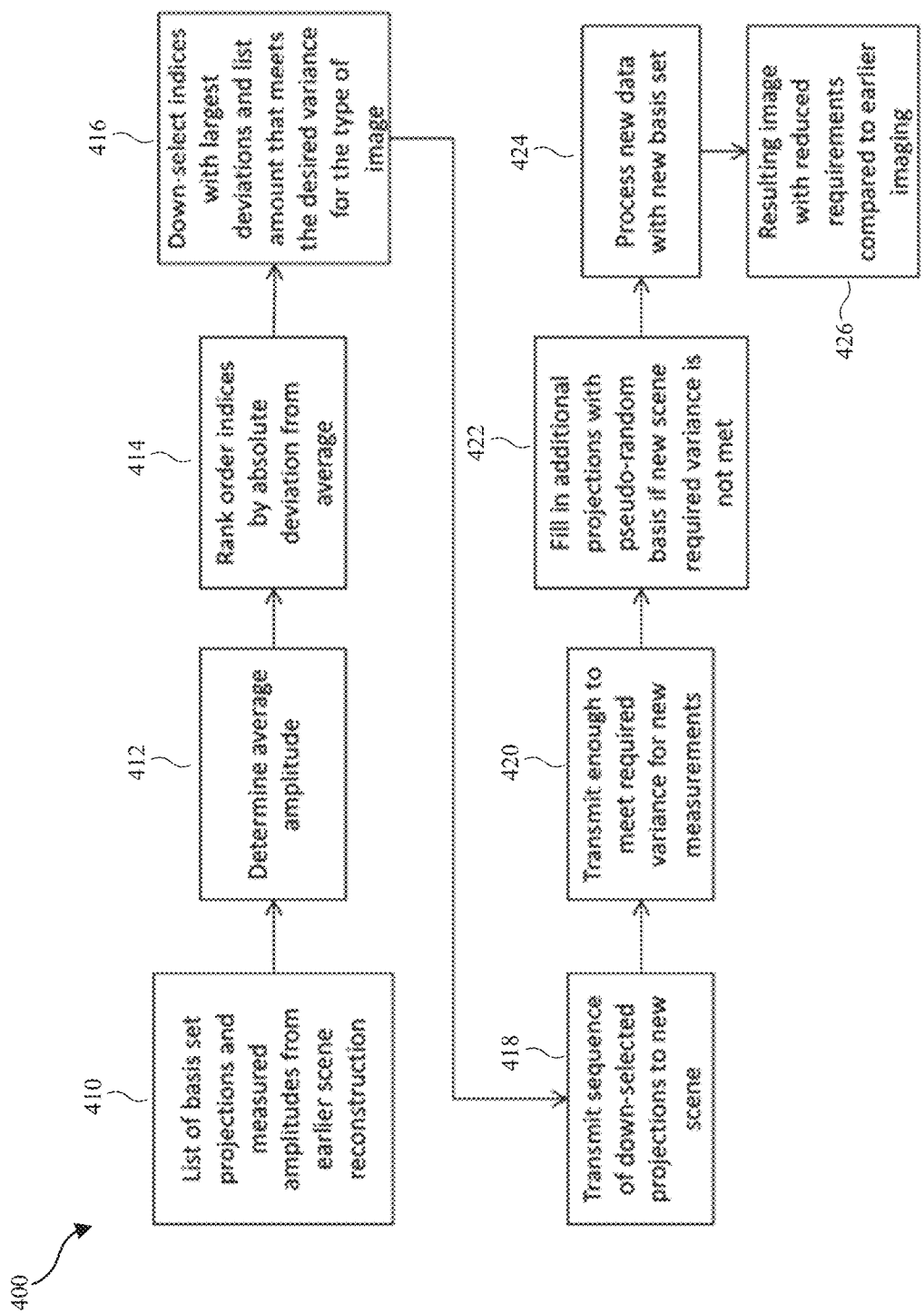
FIG. 4 is a flow diagram illustrating an example of an algorithm for compressive sensing for efficient change detection, according to certain aspects of the disclosure.

FIG. 4 is a flow diagram illustrating an example of an algorithm 400 for compressive sensing for efficient change detection, according to certain aspects of the disclosure. The required number of measurements of a scene can be further reduced when there is prior information about the scene. One example includes using the results of a prior measurement, or applying the basis set through simulation to a prior image of the scene obtained through other methods. The algorithm 400 starts at operation block 410, where the list of basis set projections and measured (or simulated) amplitudes from earlier scene reconstruction are indexed. At operation block 412, an average amplitude and variance of the amplitudes are calculated. At operation block 414, the indexed list is rank ordered based on the absolute value of the deviation from the determined average amplitude. The list is then down-selected at operation block 416 to have elements that provide the same variance within the preselected margin. At operation block 418, the sequence of a smaller (down-selected) list of projections is used to illuminate the new scene and recover new amplitudes. At operation block 420, it is confirmed that enough projections are used to meet a required variance for the new measurement. At operation block 422, if the resulting amplitudes do not meet the required number to recover the image, as discussed below, additional projections with pseudo-random bases are used until the new scene variance and the required number of measurements is met. At operation block 424, the new projection basis set and measured amplitudes are used to generate the resulting image of the new scene 426. The result of the algorithm 400 shows an order-of-magnitude improvement for small scene demonstrations. For larger areas, the algorithm 400 can provide up to two orders-of-magnitude reduction in the number of used data sets.

Figure 5:
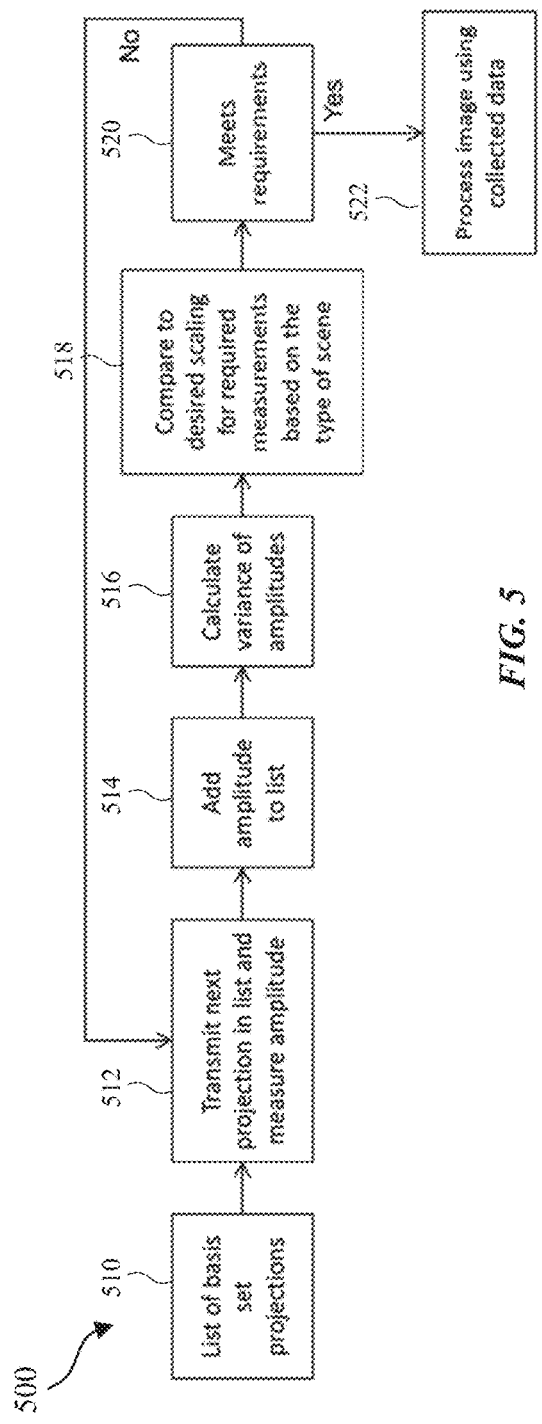
FIG. 5 is a flow diagram illustrating an example of an algorithm for estimation of data requirements based on a measured variance, according to certain aspects of the disclosure.

FIG. 5 is a flow diagram illustrating an example of an algorithm 500 for estimation of data requirements based on a measured variance, according to certain aspects of the disclosure. In order to estimate the number of measurements needed prior to processing the image, at operation block 510 the measurements are tabulated as they are collected to provide a list of basis set projections. At operation block 512, the next projection in the list is transmitted and its amplitude is measured. At operation block 514, the measured amplitude is added to the list. At operation block 516, the variance of amplitudes is calculated. The variance is monitored as the measurements proceed. Once a sufficient number of measurements have been collected, the average and variance will be stable. The variance is a measure of the scene complexity and is inversely proportional to the number of measurements needed to reconstruct the scene as a function of the number of pixels in the projected patterns (corresponding to the spatial resolution of the scene). If the variance is very small, a large number of measurements may be needed. This is because the larger the variance in amplitude of the projection measurement sequence, the more sparse the data set is. At operation block 518, the variance is compared to the desired scaling for required measurements based on the type of scene. At operation block 520, it is checked whether the requirements are met. If the requirements are not met, control is passed to operation block 512. If the requirements are met, control is passed to operation block 522, where the resulting image is processed using collected data. The algorithm 500 allows a metric for setting the number of required measurements after taking an order-of-magnitude fewer measurements than are necessary to reconstruct the image.

Figure 6:
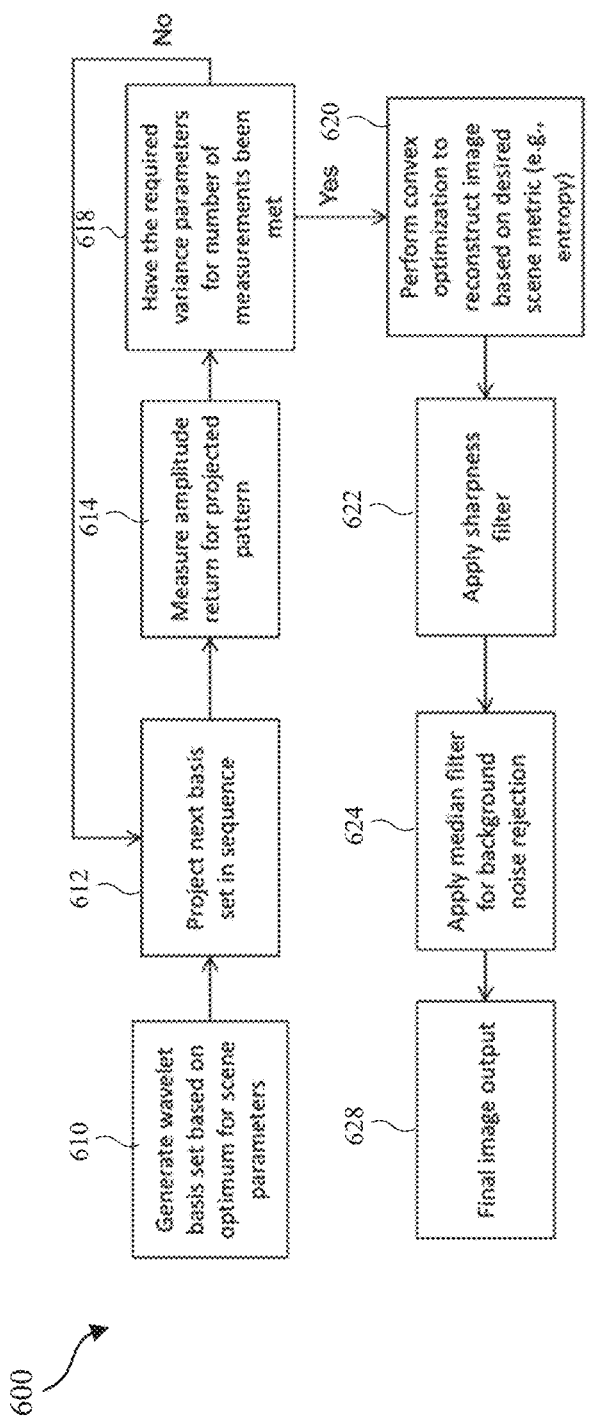
FIG. 6 is a flow diagram illustrating an example of an algorithm for expansion to wavelet basis set based on the scene entropy metric of the image, according to certain aspects of the disclosure.

FIG. 6 is a flow diagram illustrating an example of an algorithm 600 for expansion to wavelet basis set based on the scene entropy metric of an image, according to certain aspects of the disclosure. The algorithm 600 is a method of modifying the measurements for implementations based on wavelet decomposition. The algorithm 600 starts at operation block 610, where a wavelet basis set is generated based on an optimum for scene parameters. The wavelet basis (pattern) is generated for the desired scene, instead of using a uniformly filled pattern. This can be created using a set of mutually orthogonal projections obtained using several methods including discrete cosine transforms. At operation block 612, the next basis set is projected in sequence. This sequence is then used, at operation block 614, as the projection basis set to measure the amplitude return for each pattern illuminating the scene. The variance of the amplitudes provides a metric for how many measurements must be made.

At operation block 618, it is determined whether the required variance parameters for the number of measurements are met. If the required variance parameters are not met, control is passed to operation block 612. If the required variance parameters are met, control is passed to operation block 620, where the same convex optimization is implemented to reconstruct the image based on the desired scene metric (e.g., entropy). Optional improvements can be achieved by applying sharpness filters (at operation block 622) and median filters (at operation block 626) to the reconstructed image to form the final image output 628.

Figure 7:
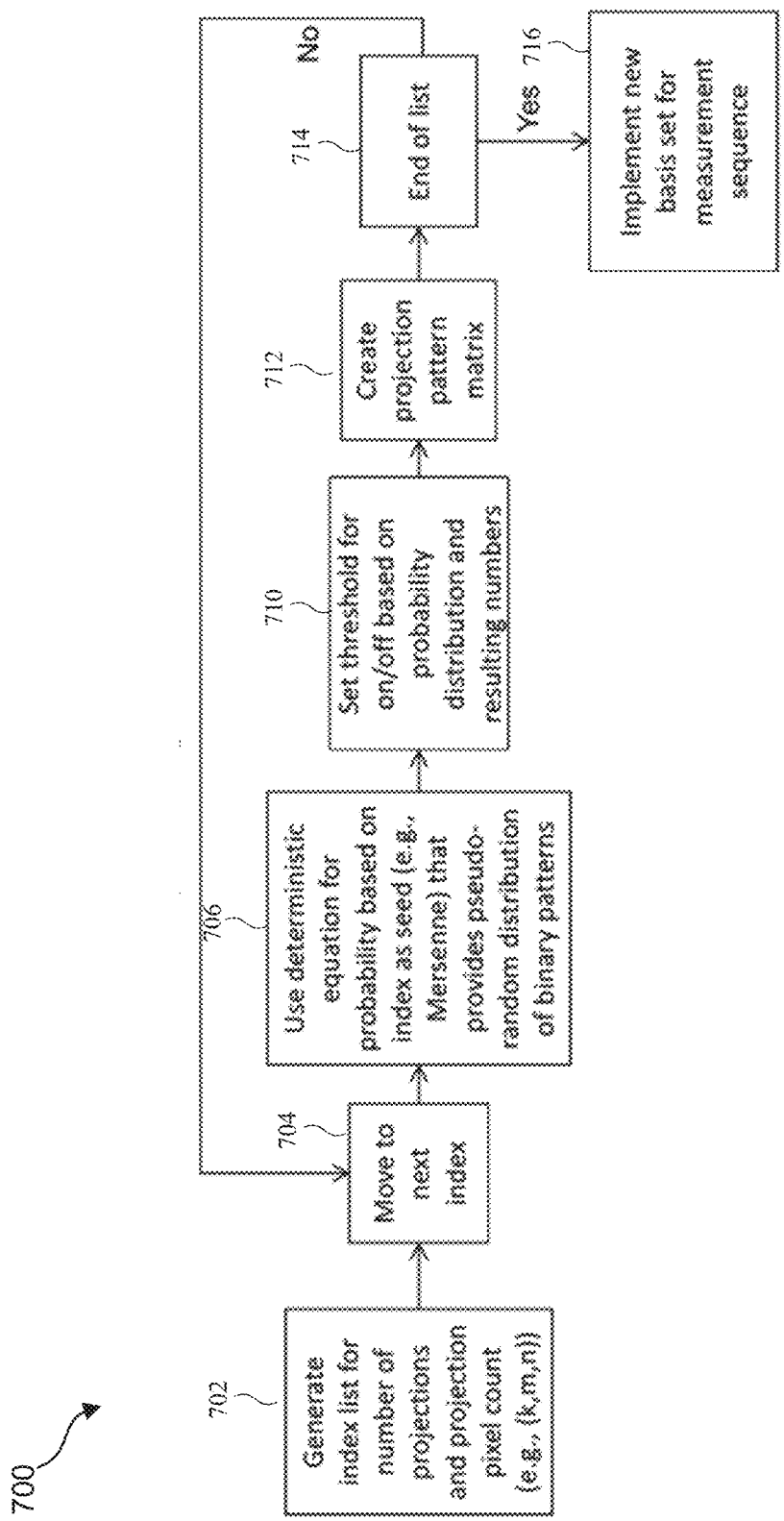
FIG. 7 is a flow diagram illustrating an example of a method of implementing a deterministic basis set, according to certain aspects of the disclosure.

FIG. 7 is a flow diagram illustrating an example of a method 700 of implementing deterministic basis set, according to certain aspects of the disclosure. In the earlier examples, a pseudo-random basis set was used as the projection input patterns. In order to remove the need to store the projection basis set, a deterministic pattern has been generated that has the same efficiency as the random basis set. The method 700 starts at operation block 702, where an indexed matrix is created for a projection basis set and amplitudes are measured. The input is the index list of projection index and pixel count in x and y (k, m, n), where k is the index of the basis element, m is the number of pixels across the pattern in the x axis, and n is the number of pixels across the pattern in the y axis. At operation block 704, the process is moved to the next index. At operation block 706, the amplitudes are updated for reconstruction for convex optimization, for which a deterministic equation (e.g., Mersenne algorithm) can be solved to provide the sequence used to map to the pattern. At operation block 710, the threshold for on and/or off is based on probability distribution and resulting numbers. At operation block 712, projection pattern matrix is created. At operation block 714, it is checked whether end of the list is reached. If the end of the list is not reached, control is passed to operation block 704. If the end of the list is reached, at operation block 716 a new basis set for the measurement sequence is implemented. The sequence can be processed as needed either to generate either the projection patterns for projection or for computation in reconstructing the scene from the measured amplitudes.

Figure 8:
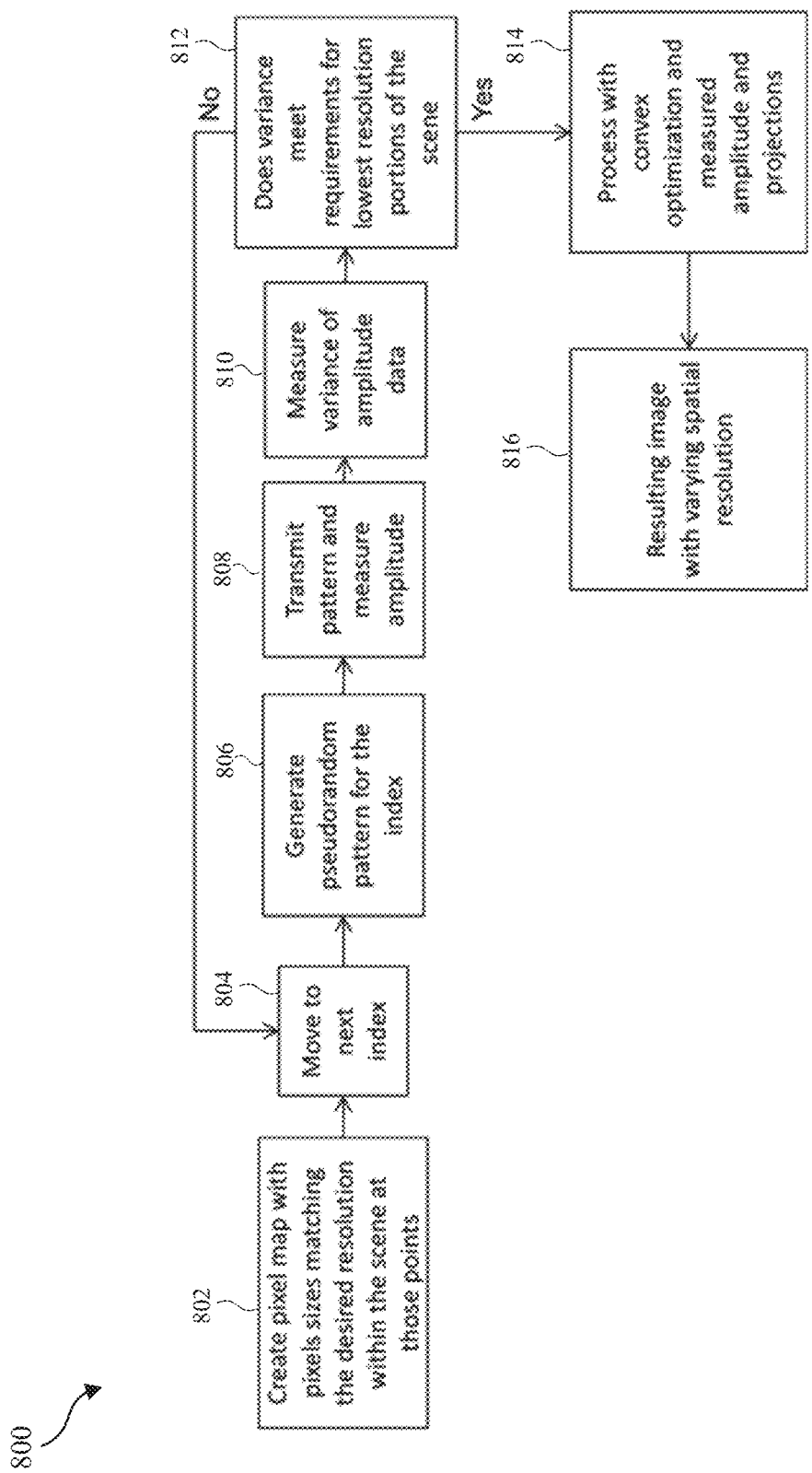
FIG. 8 is a flow diagram illustrating an example of a method for reduction of platform pointing requirements, according to certain aspects of the disclosure.

FIG. 8 is a flow diagram illustrating an example of a method 800 for implementation of foveated imaging, according to certain aspects of the disclosure. The method 800 shows the steps for processing a foveated imaging example where the spatial resolution is not uniform within the image. The method 800 starts at operation block 802, where a pixel map (grid), with pixels sized to match the desired resolution within the scene at the points within the region of interest, is created. The grid is used to generate an index for each element and a sequence of patterns is generated using either pseudo-random, wavelet, or deterministic pattern generation mapped onto the nonuniform grid. At operation block 804, the processing is moved to the next index.

At operation block 806, a pseudo-random pattern for the next index is generated. At operation block 808, these patterns are transmitted to the target (or used as a filter for the return light) and the resulting amplitude for the scattered light from each pattern is measured. At operation block 810, a variance of the amplitude data is measured. The variance requirements from earlier are modified to match the expected variance for the lowest resolution parts of the scene, since this will have a lower variance corresponding to a larger number of measurements required. At operation block 812, it is determined whether the variance meets the requirements for the lowest resolution portions of the scene. If the variance does not meet the requirements, control is passed to operation block 804. If the variance meets the requirements, control is passed to operation block 814, where the measured amplitude and projections are processed using convex optimization to reconstruct the image. The reconstruction works in the same way as the earlier description, with convex optimization providing the reconstructed image with nonuniform resolution.

Figure 9:
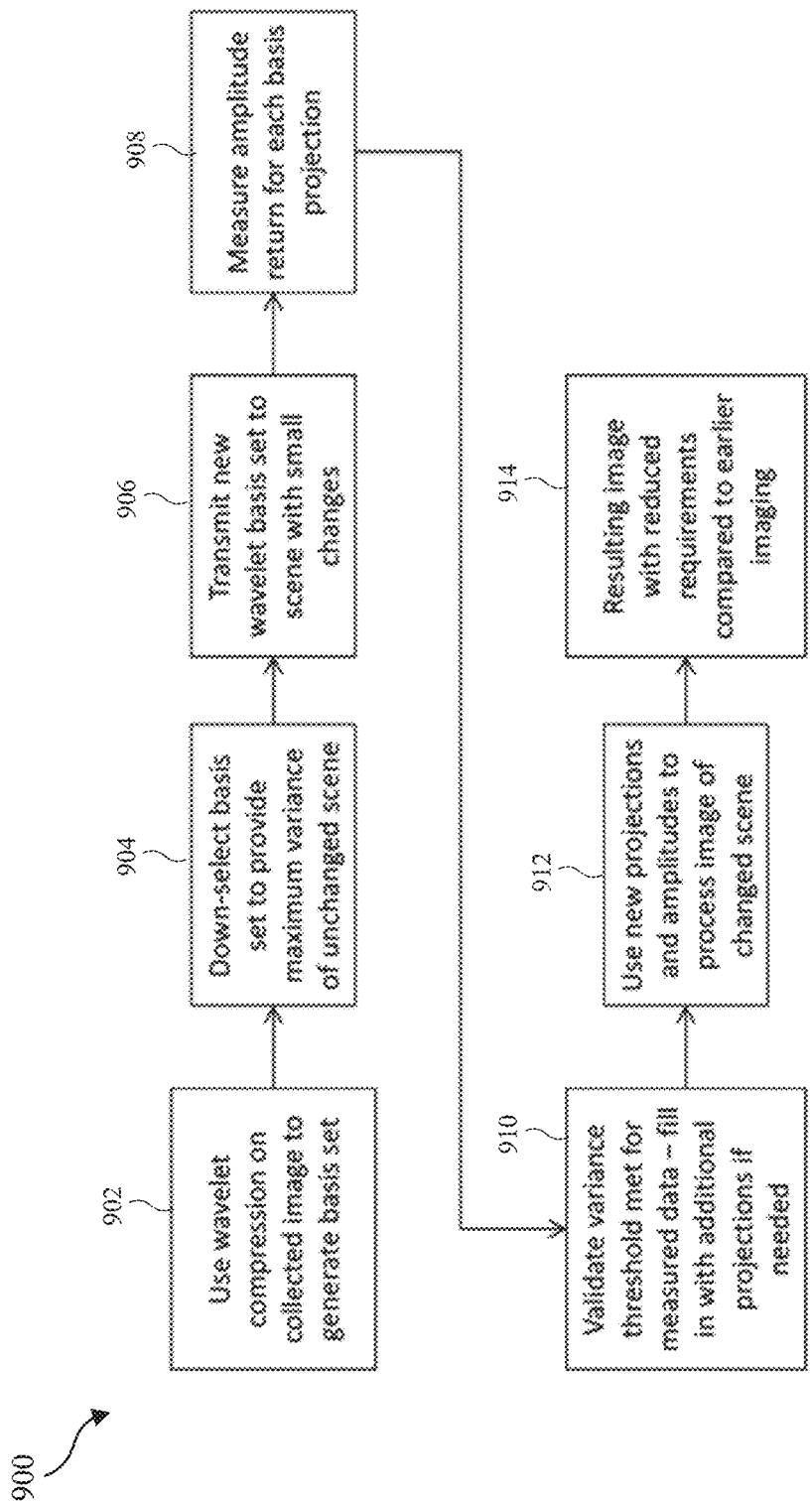
FIG. 9 is a flow diagram illustrating an example of a method for additional reduction of measurements for change detection for imaging, according to certain aspects of the disclosure.

FIG. 9 is a flow diagram illustrating an example of a method 900 for additional reduction of measurements for change detection for imaging, according to certain aspects of the disclosure. The additional reduction of measurements by using prior scene information can be obtained by generating a wavelet basis set generated by using a prior image of the scene. Instead of generating simulated amplitudes and down-selecting as described earlier, the prior image can be processed for wavelet compression. The method 900 starts at operation block 902, where a wavelet basis set is generated by using wavelet compression on a collected set of images. At operation block 904, the wavelet basis set is down-selected to provide maximum variance of unchanged scenes. The wavelet amplitudes and matrices are used to construct the basis projection elements. At operation block 906, the wavelet basis set is transmitted to illuminate a scene with small changes. At operation block 908, wavelet amplitude for the scattered light for each projection is measured. At operation block 910, it is determined whether variance threshold for measured data is met, and if there are not enough elements, then the required number of measurements can be achieved by either increasing the number of wavelet basis elements or filling in with a pseudo-random pattern. These pseudo-random patterns can be first tested with the earlier image to select the largest variance in the amplitude. At operation block 912, the new projections and amplitudes are used to process the image of the changed scene. Finally, at operation block 914 the image is reconstructed through convex optimization in the same manner as earlier, and the resulting image with reduced requirements is compared with earlier images. For large scenes, this approach can provide up to two orders-of-magnitude reduction of the required measurements to reconstruct a scene with small changes compared to an earlier image.

Figure 10:
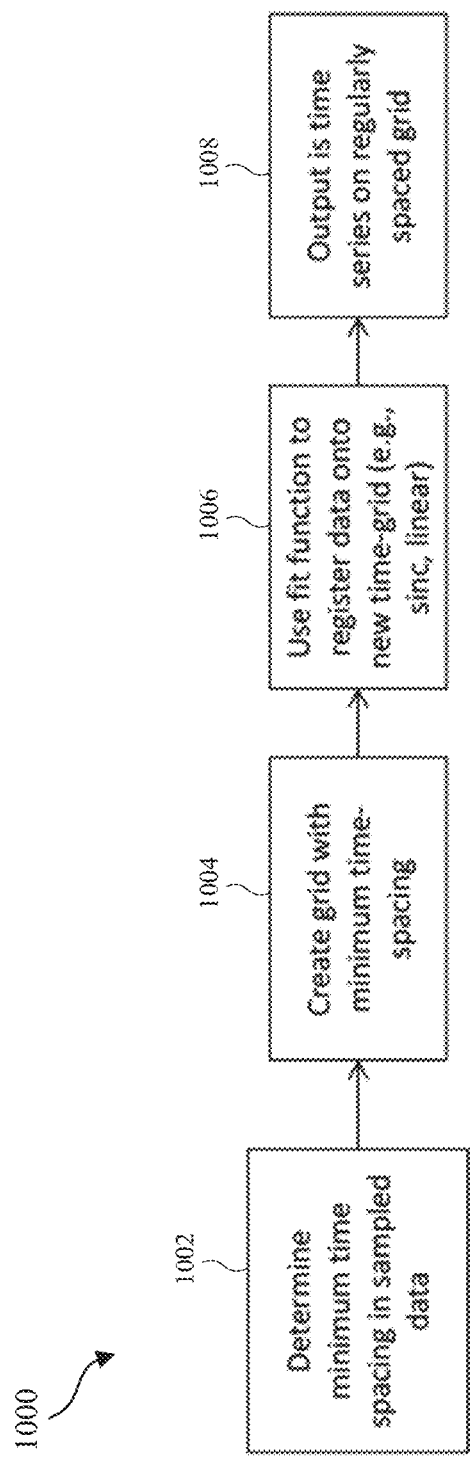
FIG. 10 is a flow diagram illustrating an example of a method for nonlinear fast Fourier transform (FFT) for efficient sparsely sampled signal recovery, according to certain aspects of the disclosure.

FIG. 10 is a flow diagram illustrating an example of a method 1000 for nonlinear fast Fourier transform (FFT) for efficient sparsely sampled signal recovery, according to certain aspects of the disclosure. An alternative processing method can be implemented to recover the signal for ladar signals. The method 1000 starts at operation block 1002, where minimum time spacing between sample data is determined. At operation block 1004, a new grid is set using the minimum time spacing in the sampled data. At operation block 1006, a fitting of the data is performed by using a fit function to interleave the sampled data onto the new uniform time grid. There are several examples of fit functions that can be used, including sin x/x, linear fits, and polynomial. At operation block 1008, the output that is now on a uniform grid can be processed efficiently using standard window functions.

Figure 11:
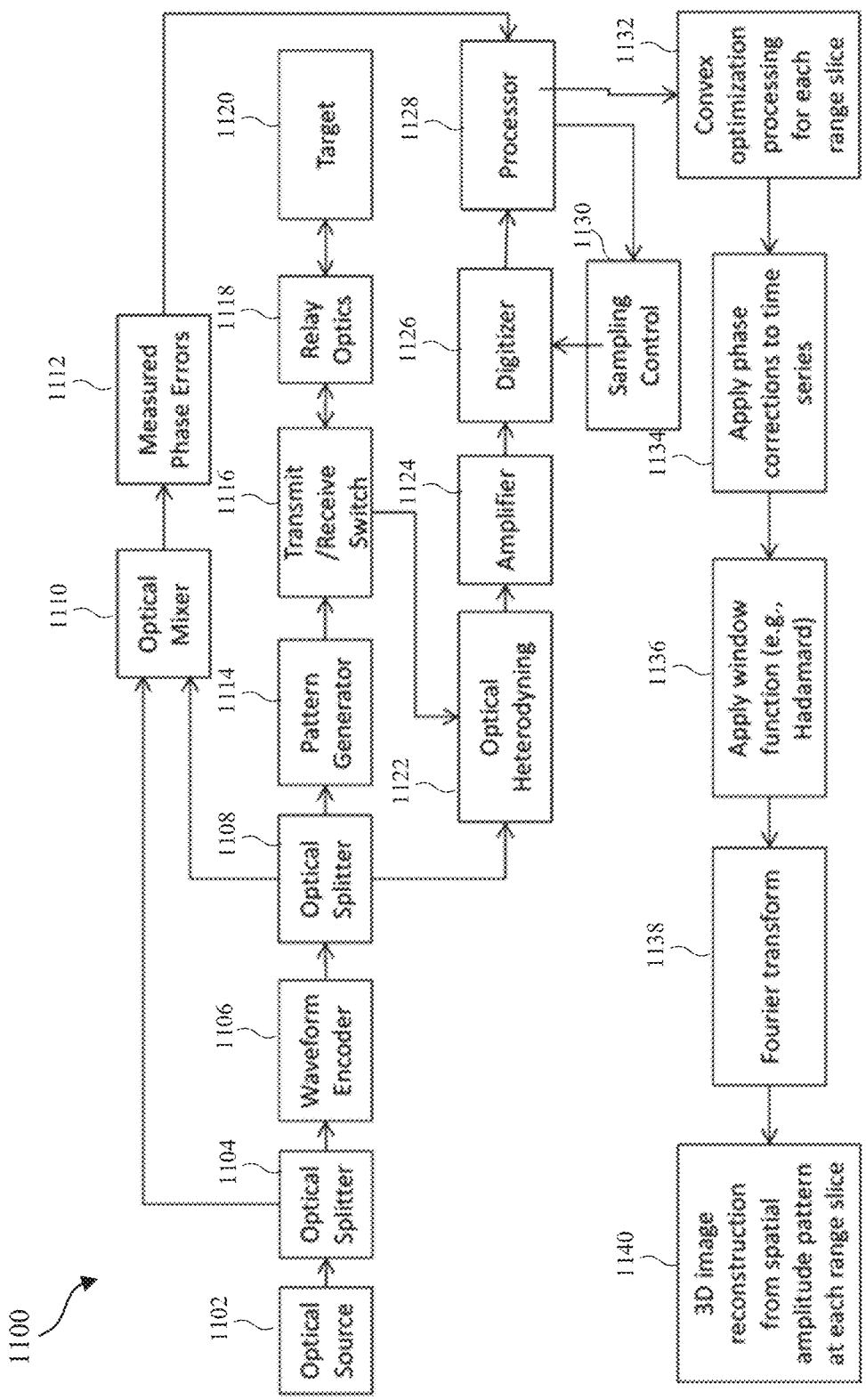
FIG. 11 is a schematic diagram illustrating an example of a system architecture for a combination of spatial and temporal active compressive sensing for 3D surface recovery, according to certain aspects of the disclosure.

FIG. 11 is a schematic diagram illustrating an example of a system architecture 1100 for a combination of spatial and temporal active compressive sensing for 3D surface recovery, according to certain aspects of the disclosure. The system architecture 1100 uses a combination of the spatial compressive sensing and temporal ladar signal compressive sensing to recover 3D imaging data with active compressive sensing. The system architecture 1100 includes an optical source 1102, a first optical splitter 1104, a waveform encoder 1106, a second optical splitter 1108, an optical mixer 1110, a pattern generator 1114, transmit/receive switch 1116, a relay optics 1118, a target 1120, an optical heterodyne module 1122, an amplifier 1124, a digitizer 1126, a processor 1128, a sampling control 1130, a convex optimization processing module 1132, a phase correction module 1134, a window function module 1136, a Fourier transform module 1138 and a 3D image reconstruction module 1140.

The optical source 1102 can be a laser diode, fiber laser, super-luminescent LED, or LED. The first and second optical splitters 1104 and 1108 can be free space beam splitters or fiber-based splitters. The waveform encoder 1106 can be a direct modulator of the optical source, an acousto-optic modulator, a Mach-Zehnder-based amplitude modulator, a phase modulator, or a combination of these devices to create the desired waveform. The optical mixer 1110 receives signals before and after the waveform encoder 1106 in two different paths and can be a beam splitter with the appropriate delays on each path in order to create a phase signal to measure the waveform characteristics. The optical mixer 1110 generates measured waveform phase errors 1112, which are passed to the processor 1128. The pattern generator 1114 can be a MEMS mirror array or liquid crystal spatial light modulator and can spatially modulate the intensity of the light generated by the optical source 1102. The transmit/receive switch 1116 can be a nonpolarizing beam splitter, a polarizing beam splitter, or a Faraday crystal-based device, which can be either free-space or fiber-based components. The relay optics 1118 maps the light from the transmit/receive switch 1116 to a region of interest at the location of the target 1120.

The optical heterodyne module 1122 is a heterodyne detector that can use either free space or fiber-based components, including beam splitters, to mix the signals received from the transmit/receive switch 1116 in a heterodyne, balanced heterodyne, quadrature, or balanced quadrature configuration. The signal from the heterodyne detector can then be passed through an amplifier 1124 prior to the digitizer 1126. The digitized signal from the digitizer 1126 is then passed to the processor 1128 for processing. The sampling control module 1130 controls sampling of the digitizer 1126. The sampling control module 1130 can take either regularly sampled data or randomly spaced samples from the processor 1128, with a controlled distribution setting the moments of the time spacing. The measured waveform phase errors 1112 is sent by the processor 1128 to the phase correction module 1134 after a convex optimization processing for each range slice by the convex optimization processing module 1132. The phase correction module 1134 makes a correction to the sampled data either in the time domain or frequency domain or in a combination of time and frequency domains. The corrected data is then windowed, by the window function module 1136, using any (or no) windows function. The windowed corrected data is then passed to the Fourier transform module 1138. The output of the Fourier transform module 1138 is used by the 3D image reconstruction module 1140 to reconstruct the 3D image from the spatial and amplitude pattern at each range slice.

In one or more implementations, the sampling control module 1130, the convex optimization processing module 1132, the phase correction module 1134, the window function module 1136, the Fourier transform module 1138 and the 3D image reconstruction module 1140 can be implemented in hardware, firmware or software executable by the processor 1128 or any other processor of the system including a general processor.

Figure 12:
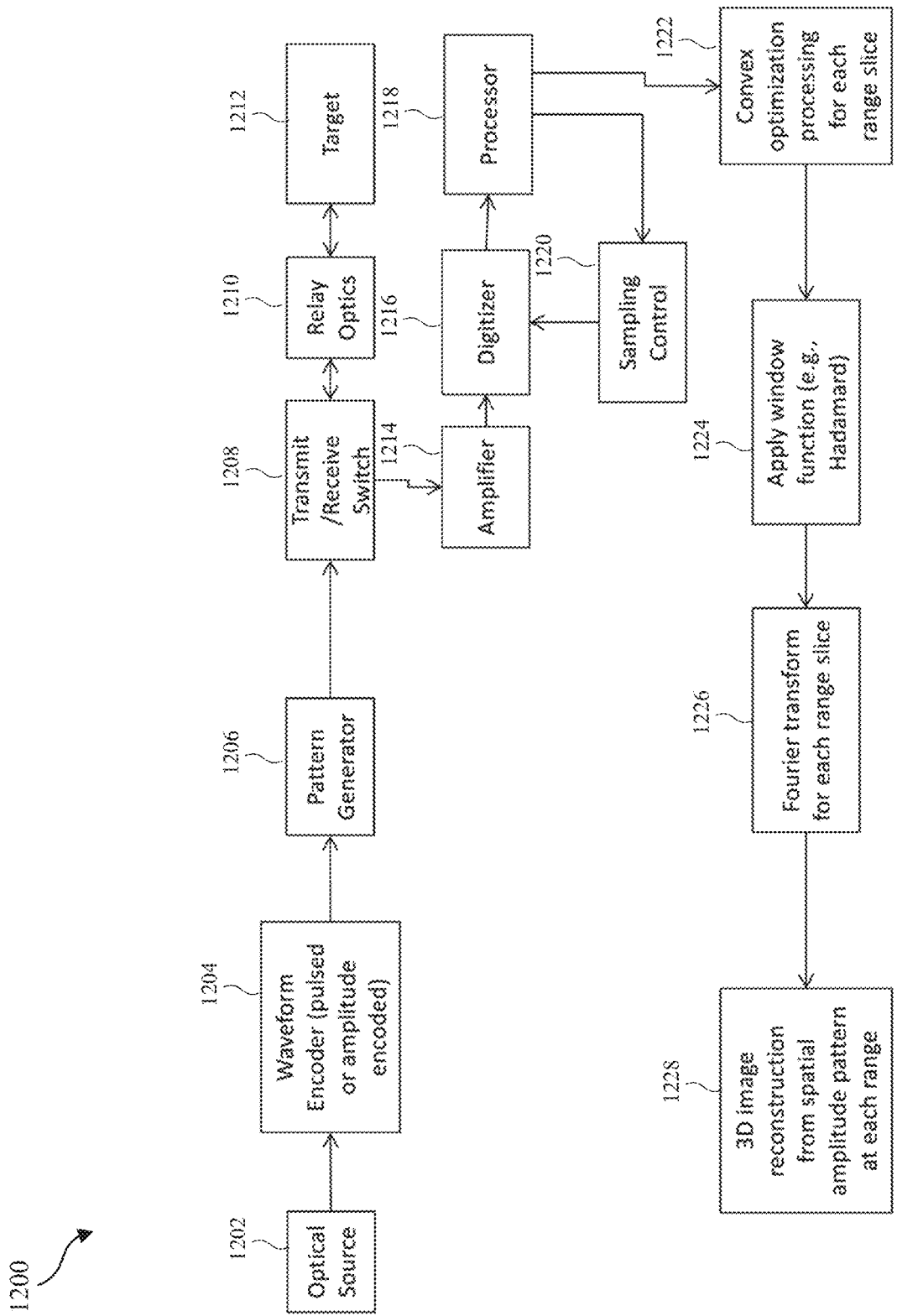
FIG. 12 is a schematic diagram illustrating an example of a system architecture for a combination of spatial and temporal active compressive sensing for 3D surface recovery and linear mode detection, according to certain aspects of the disclosure.

FIG. 12 is a schematic diagram illustrating an example of a system architecture 1200 for a combination of spatial and temporal active compressive sensing for 3D surface recovery and linear mode detection, according to certain aspects of the disclosure. The system architecture 1200 is a direct detection system implementation and combines the architectures for the spatial compressive sensing and temporal ladar signal compressive sensing to recover 3D imaging data with active compressive sensing. The system architecture 1200 includes an optical source 1202, a waveform encoder 1204, a pattern generator 1206, a transmit/receive switch 1208, a relay optics 1210, a target 1212, an amplifier 1214, a digitizer 1216, a processor 1218, a sampling control module 1220, a convex optimization processing module 1222, a window function module 1224, a Fourier transform module 1226 and a 3D image reconstruction module 1228.

In one or more implementations, the sampling control module 1220, the convex optimization processing module 1222, the window function module 1224, the Fourier transform module 1226 and the 3D image reconstruction module 1228 can be implemented in hardware, firmware or software executable by the processor 1228 or any other processor of the system such as a general processor.

The optical source 1202 can be a laser diode, fiber laser, super-luminescent LED, or LED. The waveform encoder 1204 can be a direct modulator of the optical source, an acousto-optic modulator, a Mach-Zehnder-based amplitude modulator, a phase modulator, or a combination of these devices to create the desired waveform. The pattern generator 1206 can be a MEMS mirror array or liquid crystal spatial light modulator and can spatially modulate the intensity of the light generated by the optical source 1202. The transmit/receive switch 1208 can be a nonpolarizing beam splitter, a polarizing beam splitter, or a Faraday crystal-based device, which can be either free-space or fiber-based components. The relay optics 1210 maps the light from the transmit/receive switch 1208 to a region of interest at the location of the target 1212.

The amplifier 1214 amplifies the signal from the transmit/receive switch 1208, which is converted to a digital signal by the digitizer 1216. The digitized signal from the digitizer 1216 is then passed to the processor 1218 for processing. The sampling control module 1220 controls sampling of the digitizer 1216. The sampling control module 1220 can take either regularly sampled data or randomly spaced sample from the processor 1218, with a controlled distribution setting the moments of the time spacing. The digitized signal is processed by the processor 1218, and the processed signal is sent as inputs to the sampling control module 1220 and the convex optimization processing module 1222, which performs the convex optimization for each range slice. The output of the convex optimization processing module 1222 is then windowed, by the window function module 1224, using any (or no) window function. The windowed corrected data is then passed to the Fourier transform module 1226. The output of the Fourier transform module 1226 is used by the 3D image reconstruction module 1228 to reconstruct the 3D image from the spatial amplitude pattern at each range.

Figure 13:
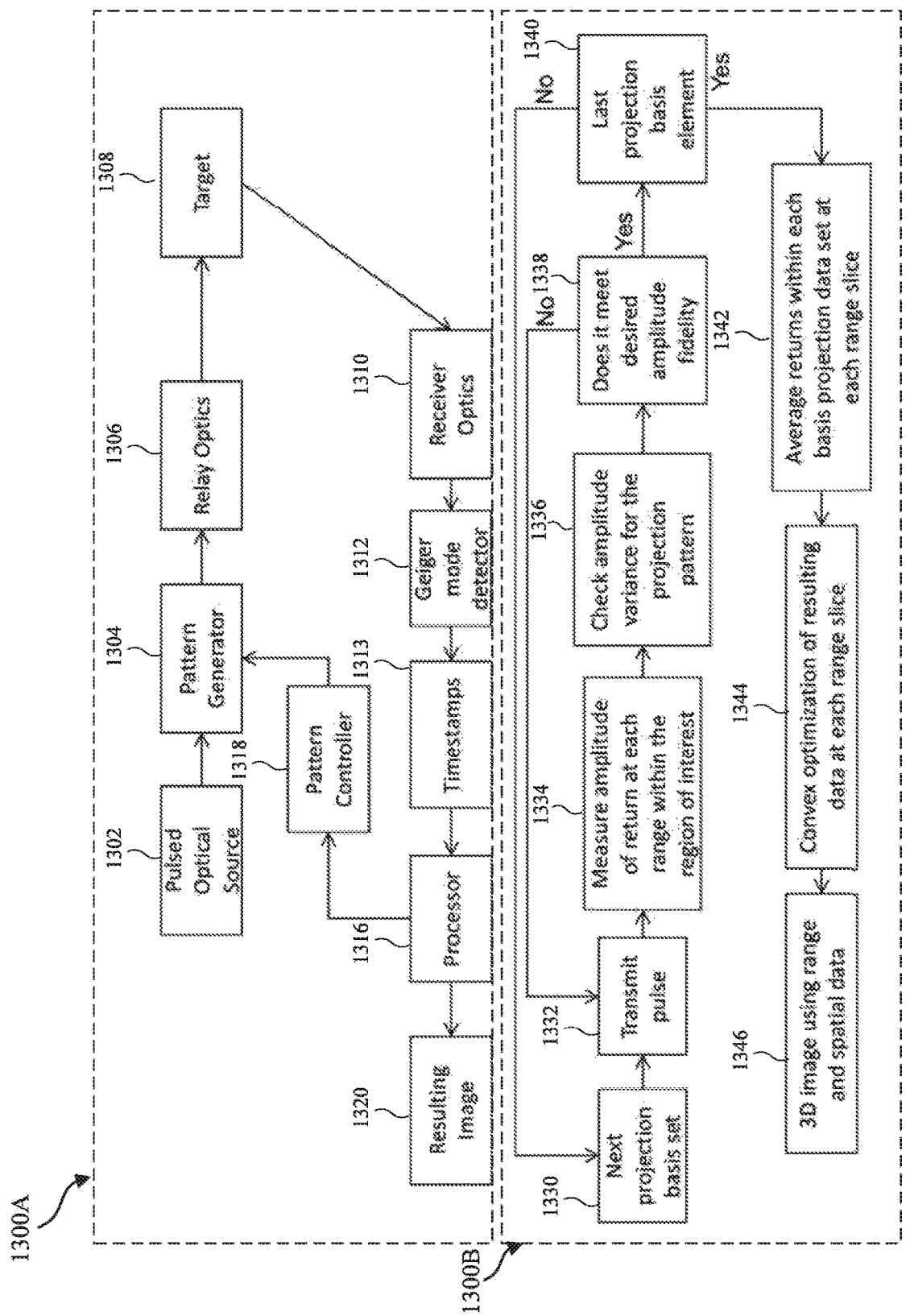
FIG. 13 is a schematic diagram illustrating an example of a system architecture and a flow chart for implementation of a Geiger mode detection, according to certain aspects of the disclosure.

FIG. 13 is a schematic diagram illustrating an example of a system architecture 1300A and a flow chart 1300B for an algorithm for implementation of a Geiger mode detection, according to certain aspects of the disclosure. The system architecture 1300A includes an optical source 1302, a pattern generator 1304, a relay optics 1306, a target 1308, a receiver optics 1310, a Geiger mode detector 1312, timestamps 1313, a processor 1316, a pattern controller 1318, and a resulting image 1320. The optical source 1302 is a light source, with examples including a laser diode, a fiber laser, a super-luminescent LED, or an LED. The pattern generator 1304 can be a MEMS mirror array or liquid crystal spatial light modulator and can spatially modulate the intensity of the light generated by the optical source 1302. The relay optics 1306 can be a single lens or a lens system that relays the spatially modulated light from the pattern generator 1304 to the target 1308, so that the generated pattern is scaled to the desired size and in focus at the target 1308. The receiver optics 1310 can include the same or a separate aperture that relays the light scattered from the target 1308 (illuminated scene) to the Geiger mode detector 1312. The electrical signal generated by the Geiger mode detector 1312 is then used to generate timestamps 1313, which are processed by the processor 1316, which performs the desired digital signal processing for the convex optimization to generate the image.

The pattern controller 1318 can be a separate interface or combined with the processor 1316 and can control the pattern generator 1304. In some implementations, the pattern controller 1318 may cause the pattern generator 1304 to select a desired pattern from a list of patterns, for example, stored in memory or select a pattern generation algorithm stored in the memory for execution by the pattern generator 1304 or the processor 1316.

The flow chart 1300B shows an algorithm for implementation with the Geiger mode detector 1312. The algorithm implements a loop to generate the amplitude for a given pattern using multiple measurements. The algorithm can be adapted to use patterns on either the transmit or receive paths. The algorithm starts at operation block 1330, where the next projection basis element set is prepared. At operation block 1332, the pulses are transmitted to illuminate the scene. At operation block 1334, the amplitudes of return signals at each range within the region of interest are measured. At operation block 1336, the amplitude variations are checked for the projection pattern. At operation block 1338, it is checked whether the desired amplitude fidelity is met. If the desired amplitude fidelity is not met, control is passed to operation block 1332. If the desired amplitude fidelity is met, at operation block 1340 it is checked whether the last projection basis element is projected. If the last projection basis element is not yet projected, control is passed to operation block 1330. If the last projection basis element is projected, control is passed to operation block 1342, where average returns within each projection basis data set at each range slice are determined. At operation block 1344, the resulting data at each range slice is processed using a convex optimization algorithm. The output is a 3D image 1346 reconstructed using range and spatial data. The pulse-repetition-frequency is set to allow the desired number of photons to be counted in the desired timeframe while keeping the average count below the saturation threshold. The data is a sequence of timestamps 1313 that are translated into a range.

Because the amplitudes must be recovered over time to avoid saturation of the Geiger mode detector, the clutter of the scene impacts a Geiger mode detection system differently than a coherent detection setup. This allows an additional opportunity to optimize the basis set based on maximizing variance of the measured projections.

Figure 14:
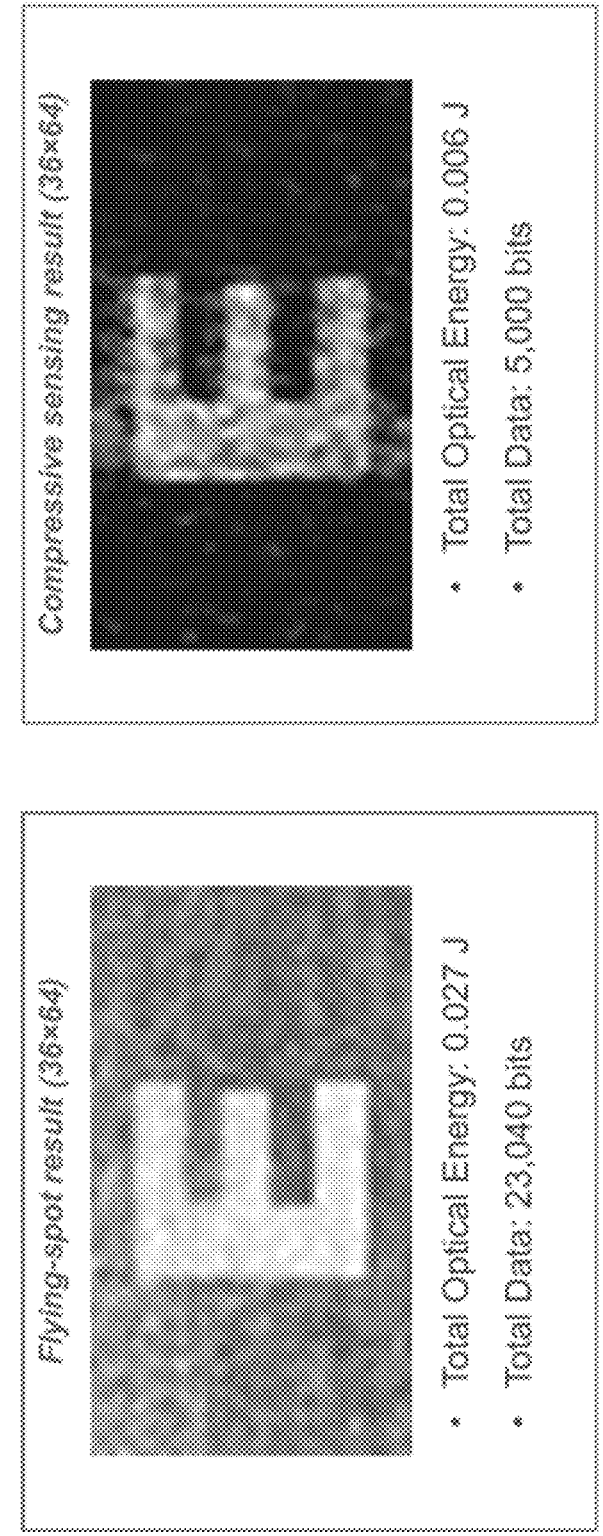
FIG. 14 is schematic diagrams illustrating an example result of compressive sensing with amplitude compensation, according to certain aspects of the disclosure.

FIG. 14 is schematic diagrams illustrating an example result of compressive sensing with amplitude compensation, according to certain aspects of the disclosure. As shown in FIG. 14, the image 1400 is provided by a flying-spot system using a total energy of 0.027 Joules and a total data of more than 23,000 bits. The image 1402 is provided by the compressive sensing system (e.g., 200 of FIG. 2) of the subject technology using a total energy of 0.006 Joules and a total data of about 5,000 bits, which depict a significant reduction in total energy (less than 20%) and total data (less than 22%) compared to the flying-spot system.

Figure 15A:
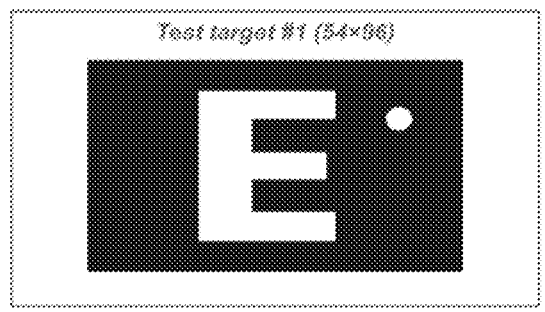
FIGS. 15A, 15B and 15C are schematic diagrams illustrating examples of test targets for change detection with reduced energy and data and corresponding imaging results, according to certain aspects of the disclosure.
Figure 15A:
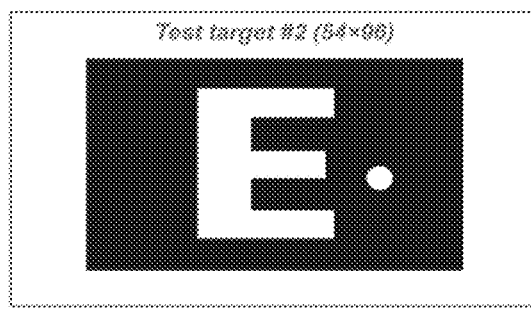
Figure 15B:
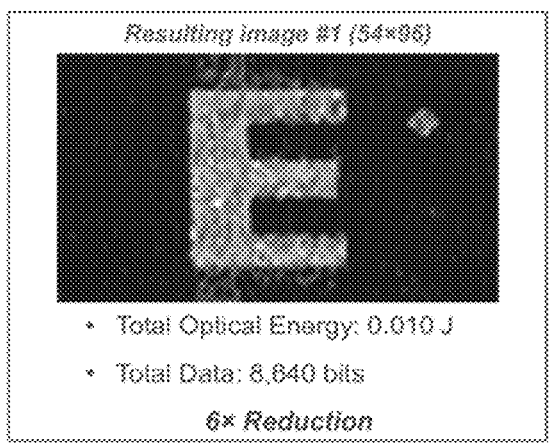
Figure 15B:
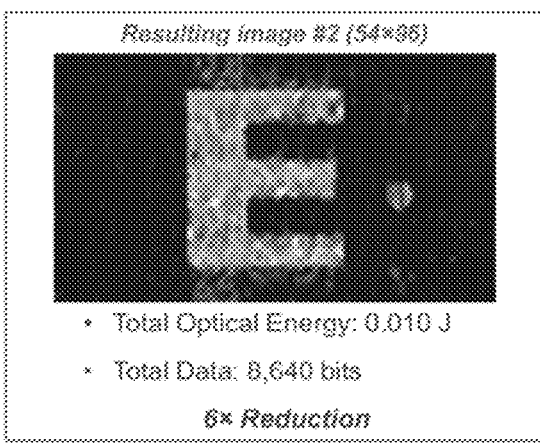
Figure 15C:
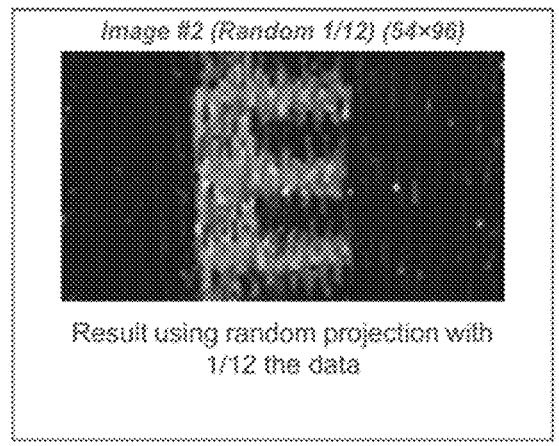
Figure 15C:
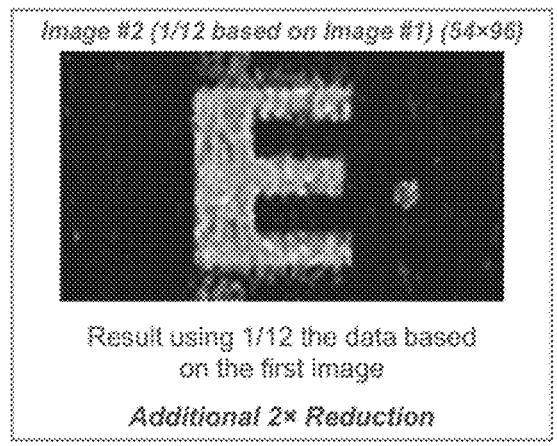

FIGS. 15A, 15B and 15C are schematic diagrams illustrating examples of test targets 1500A for change detection with reduced energy and data and corresponding resulting images 1500B and 1500C, according to certain aspects of the disclosure. The test targets 1500A show a slight difference in configuration of the test target #1 and the test target #2. The subject technology can use the image resulting from illumination of the test target #2 based on results of imaging the test target #1 using a smaller set of projections using the method 900 of FIG. 9, which creates a wavelet projection based on the initial image of target #1 and selects the projections with the widest variance around the mean to form the reduced basis set.

The resulting images 1500B show about six times (6×) reduction in total energy and total data. Further two times (×2) reduction in total energy and total data can be achieved, as shown by the images 1500C, by using a smaller set of projections to construct the image of the test target #2.

Figure 16:
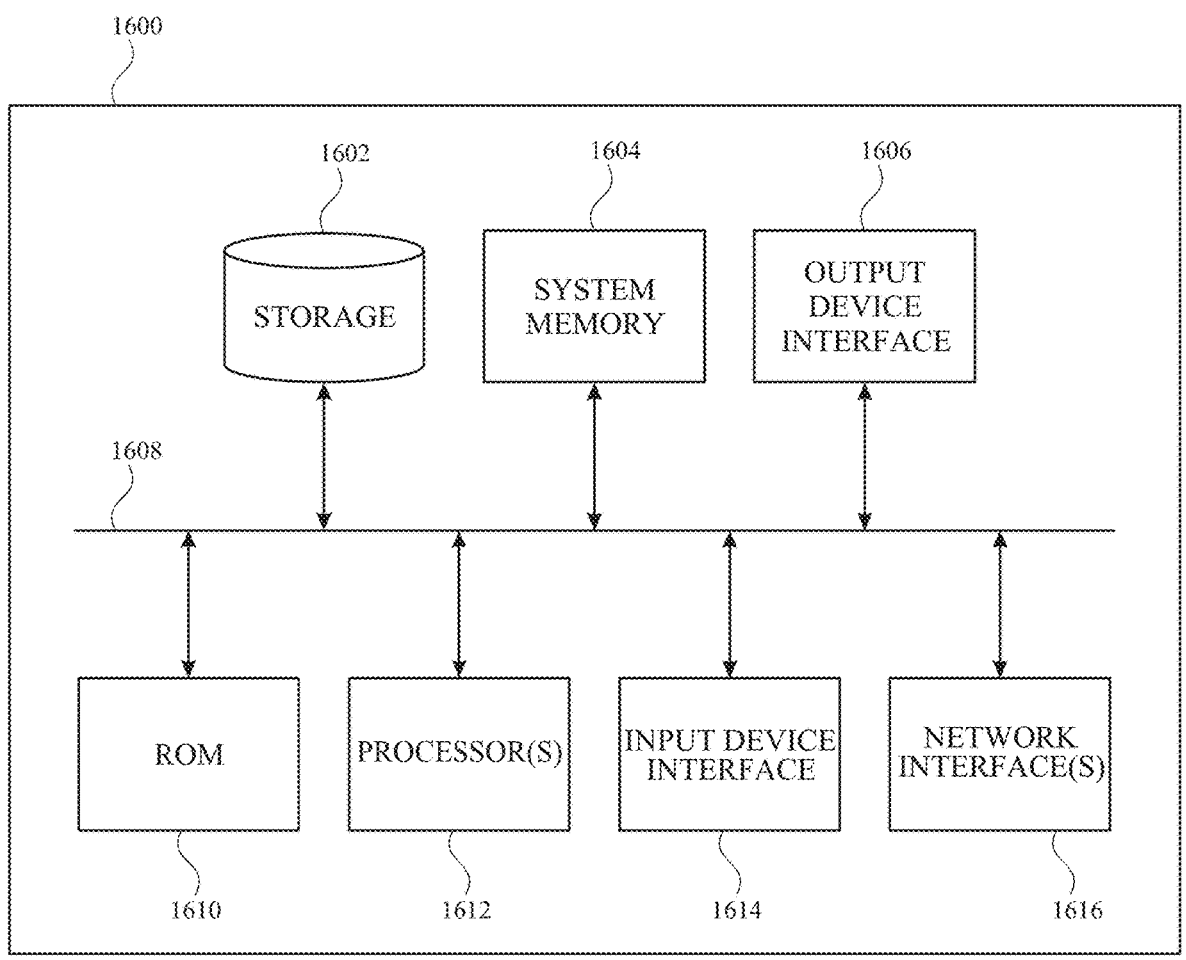
FIG. 16 is a schematic diagram conceptually illustrating an electronic system with which some aspects of the subject technology are implemented.

FIG. 16 is a schematic diagram conceptually illustrating an electronic system with which some aspects of the subject technology are implemented. Electronic system 1600, for example, can be a desktop computer, a laptop computer, a tablet computer, a server, or any device that can control and/or perform processing of data, including aggregation of data, or generally any electronic device that can process data. Such an electronic system may include various types of computer-readable media and interfaces for various other types of computer-readable media. Electronic system 1600 includes bus 1608, processing unit(s) 1612, system memory 1604, read-only memory (ROM) 1610, permanent storage device 1602, input device interface 1614, output device interface 1606, and network interface 1616, or subsets and variations thereof.

Bus 1608 collectively represents all system, peripheral, and chipset buses that communicatively connect the numerous internal devices of electronic system 1600. In one or more implementations, bus 1608 communicatively connects processing unit(s) 1612 with ROM 1610, system memory 1604, and permanent storage device 1602. From these various memory units, processing unit(s) 1612 retrieve(s) instructions to execute and data to process in order to execute the processes of the subject disclosure. The processing unit(s) 1612 can be a single processor or a multicore processor in different implementations.

ROM 1610 stores static data and instructions that are needed by processing unit(s) 1612 and other modules of the electronic system. Permanent storage device 1602, on the other hand, is a read-and-write memory device. This device is a nonvolatile memory unit that stores instructions and data even when electronic system 1600 is off. One or more implementations of the subject disclosure use a mass-storage device (such as a magnetic or optical disk and its corresponding disk drive) as permanent storage device 1602.

Other implementations use a removable storage device (such as a flash drive, and its corresponding drive) as permanent storage device 1602. Like permanent storage device 1602, system memory 1604 is a read-and-write memory device. However, unlike storage device 1602, system memory 1604 is a volatile read-and-write memory, such as random access memory (RAM). System memory 1604 stores any of the instructions and data that processing unit(s) 1612 need(s) at runtime. In one or more implementations, the processes of the subject disclosure, for example, the trained ROM, are stored in system memory 1604, permanent storage device 1602, and/or ROM 1610. From these various memory units, processing unit(s) 1612 retrieve(s) instructions to execute and data to process in order to execute the processes of one or more implementations. In one or more implementations, the processing unit(s) 1612 execute(s) various processes and algorithms of the subject technology, including algorithms and methods of FIGS. 3-12 and 13B.

Bus 1608 also connects to input and output device interfaces 1614 and 1606. Input device interface 1614 enables a user to communicate information and select commands to the electronic system. Input devices used with input device interface 1614 include, for example, alphanumeric keyboards and pointing devices (also called "cursor control devices"). Output device interface 1606 enables, for example, the display of images generated by electronic system 1600. Output devices used with output device interface 1606 include, for example, printers and display devices such as a liquid crystal display (LCD), a light emitting diode (LED) display, an organic light emitting diode (OLED) display, a flexible display, a flat-panel display, a solid-state display, a projector, or any other device for outputting information. One or more implementations may include devices that function as both input and output devices, such as a touchscreen. In these implementations, feedback provided to the user can be any form of sensory feedback, such as visual feedback, auditory feedback, or tactile feedback, and input from the user can be received in any form, including acoustic, speech, or tactile input.

Finally, as shown in FIG. 16, bus 1608 also couples electronic system 1600 to a network (not shown) through network interface 1616. In this manner, the computer can be a part of a network of computers (such as a local area network (LAN), a wide area network (WAN), or an intranet, or a network of networks, such as the Internet). Any or all components of electronic system 1600 can be used in conjunction with the subject disclosure.

In some other aspects, the subject technology may be used in various markets, including, for example, and without limitation, sensor technology, signal processing and communication markets.

Those of skill in the art would appreciate that the various illustrative blocks, modules, elements, components, methods, and algorithms described herein may be implemented as electronic hardware, computer software or a combination of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way), all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks may be performed. Any of the blocks may be performed simultaneously. In one or more implementations, multitasking and parallel processing may be advantageous. Moreover, the separation of various system components in the embodiments described above should not be understood as requiring such separation in all embodiments, and it should be understood that the described program components and systems can generally be integrated together in a single hardware and software product or packaged into multiple hardware and software products.

The description of the subject technology is provided to enable any person skilled in the art to practice the various aspects described herein. While the subject technology has been particularly described with reference to the various figures and aspects, it should be understood that these are for illustration purposes only and should not be taken as limiting the scope of the subject technology.

A reference to an element in the singular is not intended to mean "one and only one" unless specifically stated, but rather "one or more." The term "some" refers to one or more. All structural and functional equivalents to the elements of the various aspects described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

Although the invention has been described with reference to the disclosed aspects, one having ordinary skill in the art will readily appreciate that these aspects are only illustrative of the invention. It should be understood that various modifications can be made without departing from the spirit of the invention. The particular aspects disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative aspects disclosed above may be altered, combined, or modified and all such variations are considered within the scope and spirit of the present invention. While compositions and methods are described in terms of "comprising," "containing," or "including" various components or steps, the compositions and methods can also "consist essentially of" or "consist of" the various components and operations. All numbers and ranges disclosed above can vary by some amount. Whenever a numerical range with a lower limit and an upper limit is disclosed, any number and any subrange falling within the broader range are specifically disclosed. Also, the terms in the claims have their plain, ordinary meanings unless otherwise explicitly and clearly defined by the patentee. If there is any conflict in the usage of a word or term in this specification and one or more patent or other documents that may be incorporated herein by reference, the definition that is consistent with this specification should be adopted.

What is claimed is:

1. An active optical compressive sensing system, the system comprising:
    an optical source configured to generate light for illuminating a target;
    a pattern generator configured to generate a pattern; and
    a pattern controller configured to control an operation of the pattern generator to cause generation of a desired pattern,
    wherein:
    the pattern comprises a spatial filtering pattern that enables data compressing by generating sparse scattered data via creating an indexed matrix for a projection basis set and measured amplitudes and updating measured amplitudes to achieve a stable metric based on entropy.

2. The system of claim 1, wherein the pattern generator is implemented in a transmit path of a bistatic system and the pattern is applied to spatially modulate the light illuminating the target.

3. The system of claim 2, further comprising relay optics comprising a lens system configured to relay spatially modulated light from the pattern generator to the target.

4. The system of claim 1, wherein the pattern generator is implemented in a receive path of a bistatic system and the pattern is applied to spatially modulate scattered light from the target prior to detection.

5. The system of claim 4, further comprising relay optics configured to relay an image from the pattern generator to a detector, wherein the image comprises the sparse scattered data.

6. The system of claim 1, wherein the system is configured to reduce the requirement of the optical source.

7. The system of claim 1, wherein controlling the operation of the pattern generator comprises causing the pattern generator to select a desired pattern from a list of patterns or select a pattern generation algorithm.

* * * * *